United States Patent
Gordon

(10) Patent No.: US 6,181,558 B1
(45) Date of Patent: Jan. 30, 2001

(54) HEAT ABSORBER AND COMBINATION ELECTRICAL APPARATUS PRODUCING HEAT AND HEAT ABSORBER

(75) Inventor: Kerry W. Gordon, Mendham, NJ (US)

(73) Assignee: Cairns Advanced Tech. Inc., Clifton, NJ (US)

(*) Notice: Under 35 U.S.C. 154(b), the term of this patent shall be extended for 0 days.

(21) Appl. No.: 09/382,099

(22) Filed: Aug. 24, 1999

(51) Int. Cl.[7] ....................................... H05K 7/20
(52) U.S. Cl. ................. 361/699; 361/688; 361/689; 361/698; 361/700; 361/704; 361/721; 174/15.1; 165/80.4; 165/104.33; 165/185
(58) Field of Search ................ 361/688, 698–700, 361/703, 704, 707, 708, 717–719; 174/15.2, 16.3, 252; 257/712–715; 165/104.21, 104.27, 104.33, 80.2, 80.3, 185

(56) References Cited

U.S. PATENT DOCUMENTS

| 4,361,182 | 11/1982 | Michalak | 165/10 |
|---|---|---|---|
| 5,007,478 | 4/1991 | Sengupta | 165/10 |
| 5,089,914 | 2/1992 | Prescott | 359/815 |
| 5,224,356 | 7/1993 | Colvin et al. | 62/259.2 |
| 5,315,154 | * 5/1994 | Elwell | 257/707 |
| 5,449,571 | * 9/1995 | Longardner et al. | 429/120 |
| 5,455,458 | * 10/1995 | Quon et al. | 361/698 |
| 5,708,565 | * 1/1998 | Fairbanks | 361/704 |
| 5,831,831 | * 11/1998 | Freeland | 361/704 |
| 6,097,602 | * 8/2000 | Witchger | 361/699 |
| 6,104,611 | * 8/2000 | Glover et al. | 361/700 |

FOREIGN PATENT DOCUMENTS

0732743A2 * 3/1996 (EP).

* cited by examiner

Primary Examiner—Leo P. Picard
Assistant Examiner—Boris L. Chervinsky
(74) Attorney, Agent, or Firm—R. Gale Rhodes, Jr.

(57) ABSTRACT

A heat absorber including a container providing an internal cavity, phase change material, such as microencapsulated phase change material, residing in the cavity, the container including at least one wall of thermally conductive material in thermal contact with the phase change material, such one wall provided with a plurality of spaced apart and inwardly extending members of thermally conductive material extending inwardly into the cavity and into and in thermal engagement with the phase change material, upon heat being transferred to the phase change material the phase change material changes phase and absorbs the heat. Such heat absorber in combination with electrical apparatus which produces heat when operating.

17 Claims, 4 Drawing Sheets

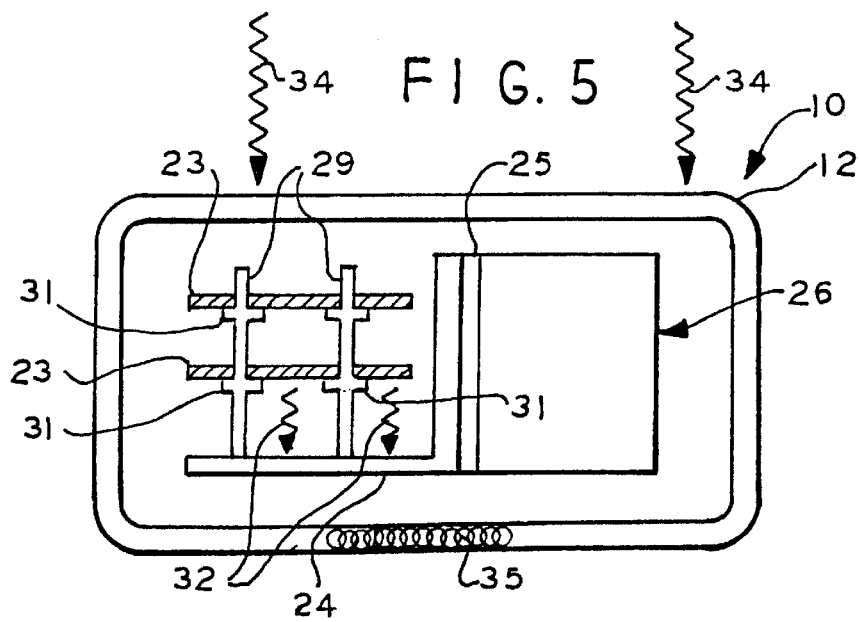
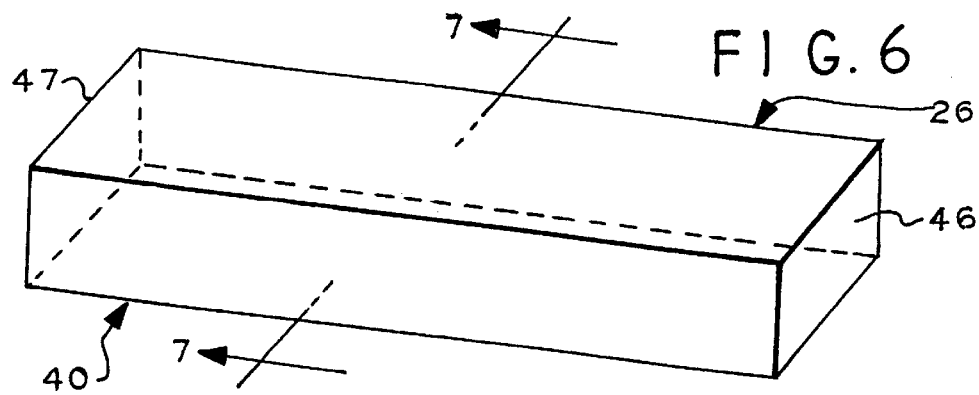
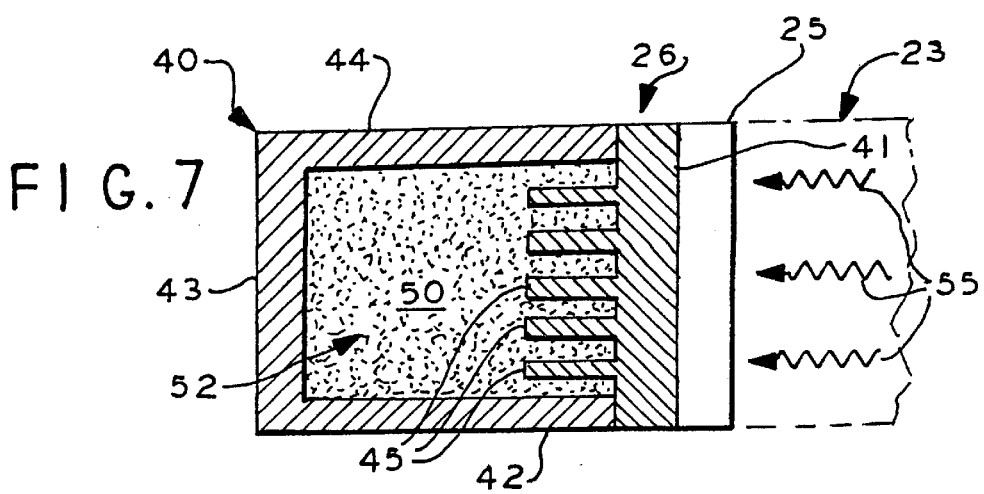

HEAT ABSORBER AND COMBINATION ELECTRICAL APPARATUS PRODUCING HEAT AND HEAT ABSORBER

BACKGROUND OF THE INVENTION

This invention relates to a heat absorber and more particularly relates to a replaceable and rechargeable or regenerable heat absorber. Further, this invention relates to the combination of electrical apparatus which produces heat when operating and to a heat absorber for absorbing such heat, particularly a replaceable and rechargeable or regenerable heat absorber. Still further, this invention, by way of example and not by way of limitation, relates to the combination of thermal or infrared (IR) imaging apparatus including electrical apparatus such as, and by further way of example and not by way of limitation, printed circuit boards which produce heat when operating and to a heat absorber for absorbing such heat, particularly a replaceable and rechargeable or regenerable heat absorber.

Thermal or infrared (IR) imaging apparatus are known to the art for providing an image in the visible spectrum, viewable by the human eye, of an object emitting or radiating infrared heat or energy. Such apparatus include thermal or infrared (IR) imaging apparatus for use by a fireman in a smoke filled burning building which apparatus enables the fireman to see, for example, the image of a human being suffering from smoke inhalation and lying unconscious on the floor but which human being is still alive and therefore radiating infrared heat or energy. Thermal imaging apparatus, of course, are inherently heat-sensitive, particularly the infrared detector and the thermoelectric cooler if included, and typically require a substantially constant operating temperature to produce suitable images. It is known to provide thermal imaging apparatus used by a firefighter with insulation to reduce the amount of heat transferred to the interior of the body of the apparatus by convection and radiation from the heated environment and particularly to the internally mounted infrared detector. An example of prior art thermal or infrared (IR) imaging apparatus is disclosed in U.S. Pat. No. 5,089,914 patented on Feb. 18, 1992, John A. Prescott, inventor, and entitled THERMAL CAMERA ARRANGEMENT; this patent is incorporated herein by reference as if fully reproduced herein.

Many different types of heat absorbers are known to the art including heat absorbers which are provided in combination with electrical apparatus which produces heat when operating and wherein the heat absorbers absorb the heat to prevent the heat from impairing the performance of the electrical apparatus and even damaging such apparatus. Heat absorbers are known to the art which include phase change material which changes phase, for example, from a solid state to a liquid state, to absorb heat produced by, for example, electrical apparatus. Such phase change material heat absorbers may include microencapsulated phase change material which may be of the type, for example, disclosed in U.S. Pat. No. 4,361,182 patented on Nov. 30, 1982, Stanislaw Michalak, inventor, and which patent is hereby incorporated herein by reference as if fully reproduced herein. A heat sink or heat absorber incorporating such microencapsulated phase change material is disclosed in U.S. Pat. No. 5,007,478 patented on Apr. 16, 1991, Subrata Sengupta, inventor, and which patent is hereby incorporated herein by reference as if fully reproduced herein. Further, a method of using microencapsulated thermal conducting absorbing materials, or phase change materials, to cool heat sources such as an electrical component is disclosed in U.S. Pat. No. 5,224,356 patented Jul. 6, 1993, David P. Colvin, et al. inventors; this patent also discloses how to fabricate microencapsulated phase change materials and this patent is hereby incorporated herein as if fully reproduced herein.

As known to the art, certain microencapsulated phase change materials appear as fine, free-flowing powders but actually consist of millions of durable capsules which contain heat absorbing core materials. These microencapsulated phase change materials can range from to several hundred microns in diameter. The core can comprise 80–85% of the material's weight, and the impermeable wall surrounding the core is typically less than one micron. These microencapsulated phase change materials are available in either a dry powder or within a liquid slurry. Such microencapsulated phase change materials are known to absorb or release large amounts of heat without a corresponding change in temperature. Microencapsulated phase change materials are available from Frisby Technologies, Inc. of Winston-Salem, N.C., under the trademark THERMASORB, and from PCM Thermal Solutions of Naperville, Ill.

SUMMARY OF THE INVENTION

A heat absorber embodying the present invention may include a container providing an internal cavity, phase change material, such as microencapsulated phase change material, residing in the cavity, the container includes at least one wall of thermally conductive material in thermal contact with the phase change material, and such one wall is provided with a plurality of spaced apart and inwardly extending members of thermally conductive material extending inwardly into the cavity and into and in thermal engagement with the phase change material, upon heat being transferred to the phase change material by the wall and plurality of members of thermally conductive material, the phase change material changes phase and absorbs the heat. This invention further embodies such heat absorber in combination with electrical apparatus which produces heat when operating, such as by way of example and not by way of limitation, printed circuit boards which produce heat when operated.

BRIEF DESCRIPTION OF THE DRAWINGS

FIG. 5 is a diagrammatical, transverse cross-section through the thermal imaging apparatus 10 shown in FIGS. 1 and 2;

FIG. 6 is a diagrammatical, perspective view of a heat absorber embodying the present invention;

FIG. 7 is a diagrammatical, transverse cross-sectional view of the heat absorber shown in FIG. 6 and taken generally along the line 7—7 in the direction of the arrows, FIG. 7 also shows the thermal or heat transfer plate of the present invention;

DETAILED DESCRIPTION OF THE INVENTION

By way of illustration, and not by way of limitation, the present invention will be described in the context of thermal or infrared (IR) imaging apparatus which include internal components, for example, printed circuit boards, which produce heat when operating and to a heat absorber for absorbing the heat in order that the heat will not have a deleterious effect on the thermal imaging apparatus. It will be understood, however, that the present invention is not limited to thermal imaging apparatus and is equally applicable to any other electrical apparatus which produces heat when operating and which heat needs to be absorbed to prevent a deleterious effect on the electrical apparatus and its various components which may be heat sensitive.

Figure 1:
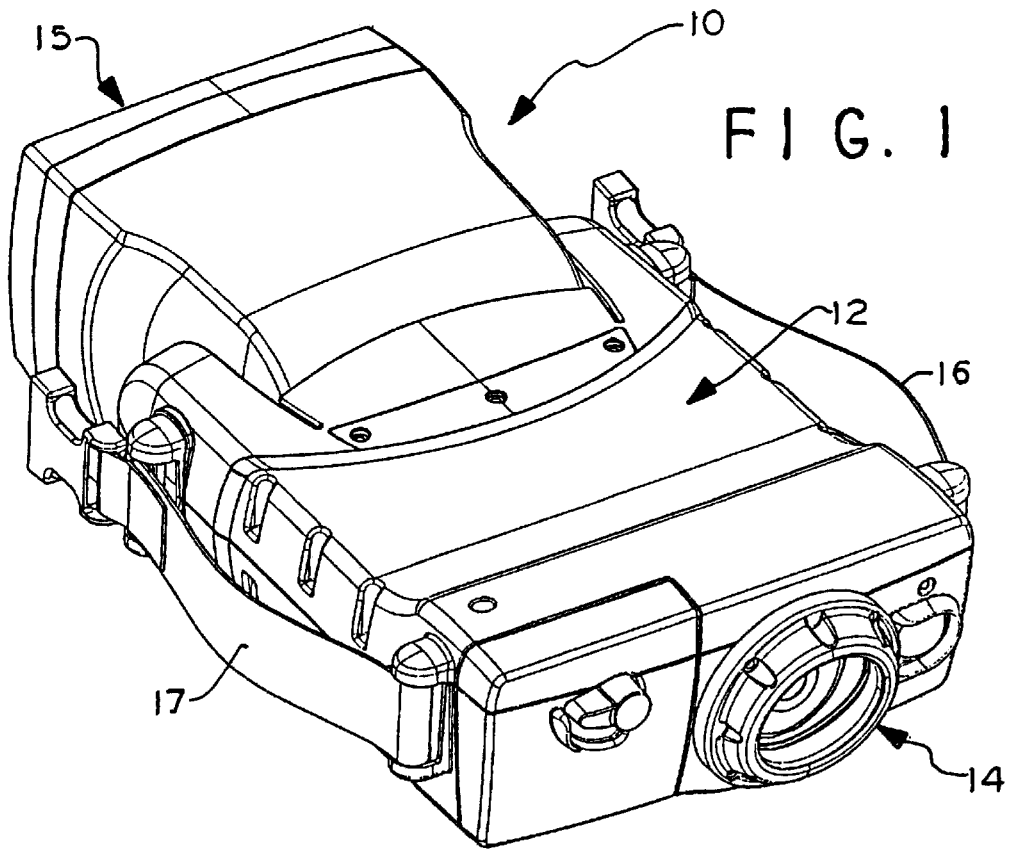
FIG. 1 is a perspective view of handheld thermal or infrared (IR) apparatus embodying the present invention.
Figure 2:
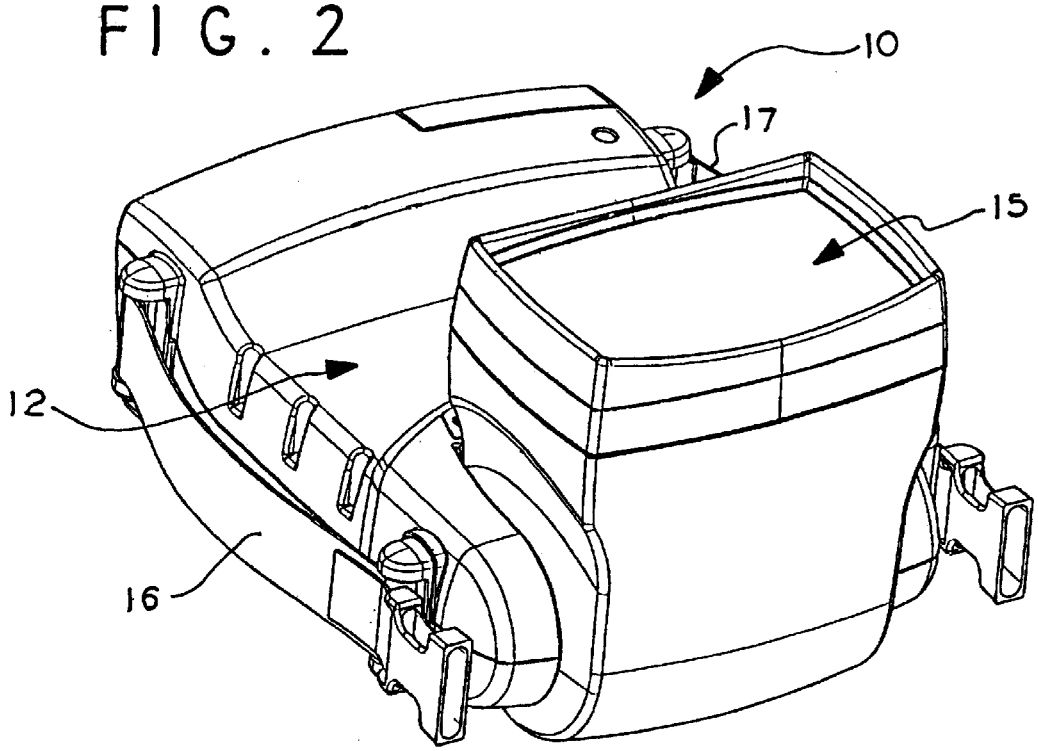
FIG. 2 is a perspective view of the apparatus shown in FIG. 1 but with the apparatus rotated 180° from FIG. 1 and showing the viewing screen rotated upwardly.

Referring to FIGS. 1 and 2, there are shown thermal or infrared (IR) imaging apparatus indicated by general numerical designation 10 and which embodies the present invention. The thermal imaging apparatus 10 may be generally of the type of thermal imaging or infrared (IR) apparatus known to the art and referred to above in the Background of the Invention. The specific thermal or infrared (IR) imaging apparatus 10 shown in FIGS. 1 and 2 are handheld thermal or infrared (IR) imaging apparatus. The apparatus 10 includes a shell or case indicated by general numerical designation 12 for housing or containing the internal components of the apparatus. Thermal or infrared (IR) imaging apparatus 10 includes a lens 14 and a viewing screen 15 which is mounted rotatably. The viewing screen 15 is shown in the horizontal position in FIG. 1 and is shown rotated 90° upwardly in FIG. 2. To facilitate its use as handheld thermal or infrared (IR) imaging apparatus, the apparatus 10 may be provided with suitable straps 16 and 17.

Figure 3:
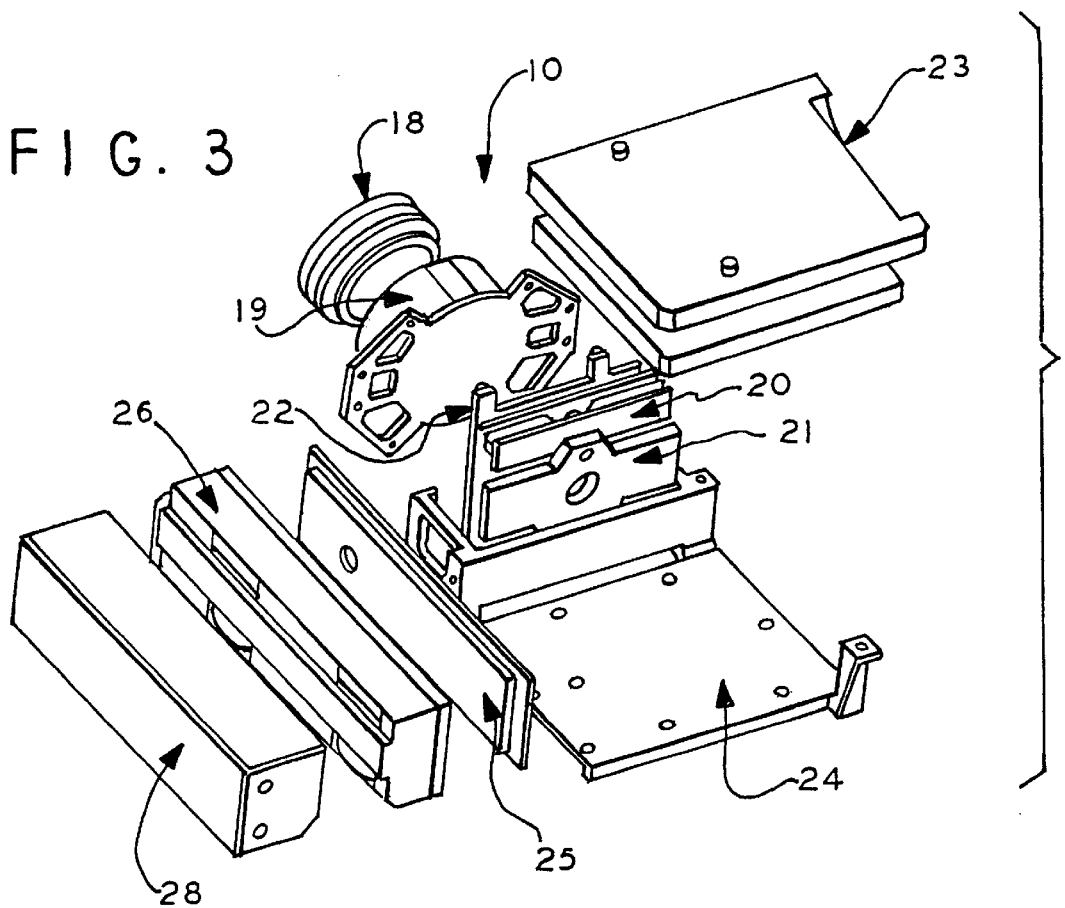
FIG. 3 is an exploded view illustrating thermal or infrared (IR) imaging apparatus components.

Referring to FIG. 3, the internal components of the thermal or infrared imaging apparatus 10 shown in FIGS. 1 and 2 are shown in an exploded view. Such components, except for the heat absorber of the present invention described in detail below, are typically of the type known to the art comprising thermal or infrared (IR) imaging apparatus. Such components may include the above-noted lens 14, a lens holder 19, a focal plane array 20 sometimes referred to as a microbolometer or infrared detector, a thermoelectric cooler (not shown), a focal plane bracket 21 to which the focal plane array 20 is mounted, a shutter mechanism 22, a plurality of printed circuit boards indicated by general numerical designation 23 which contain electrical circuits which produce heat when operating, a mounting bracket 24 to which the printed circuit boards 23 are mounted, a heat or thermal transfer plate 25, a heat absorber 26 embodying the separate heat absorber invention of the present invention, and a battery 28 for supplying energy for operating the thermal or infrared (IR) imaging apparatus 10. Generally, it is the above-noted infrared detector and thermostatic cooler that must be maintained at a substantially constant operating temperature to produce suitable images for human viewing.

Figure 4:
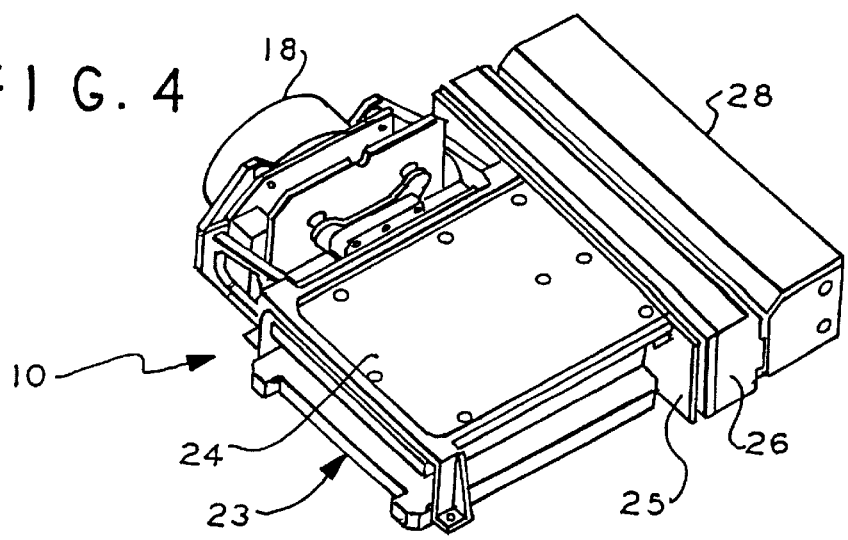
FIG. 4 is an assembly view of the components shown in FIG. 3 but with the components shown rotated 180° from that shown in FIG. 3.

The printed circuit board mounting bracket 24, FIGS. 3 and 4, is made of a suitable heat transfer material such as, for example, aluminum or aluminum alloy, or a thermally conductive plastic such as thermally conductive plastic sold by Chip Coolers, Inc. of Warwick, R.I. under the trademark CoolPoly. As illustrated diagrammatically in FIG. 5, a plurality of upwardly extending printed circuit board mounting members or rods 29, which are made of suitable heat transfer material such as aluminum or aluminum alloy, are mounted suitably, such as by brazing, to the printed circuit board mounting bracket 24, and the members 29 are provided with outwardly extending annular spacing members 31. The printed circuit board mounting members or rods 29 extend through holes provided in the printed circuit boards 23 to cause the rods 29 and the spacers 31 to mount the printed circuit boards in a spaced apart vertical relation on the mounting bracket 24 whereby heat produced by the printed circuit boards 23 when operating is transferred to the mounting bracket 24 by conduction through the rods 29 and by convection as indicated by the irregular arrows 32 in FIG. 5. Referring again to FIGS. 3 and 4, and further to FIG. 5, the heat or thermal transfer plate 25 is mounted suitably, such as by metal screws, to the printed circuit board mounting bracket 24 to place the thermal or heat transfer plate 25 in mechanical and heat transfer engagement with the bracket 24 whereby, as will be readily understood from FIG. 5, heat transferred to the printed circuit board mounting bracket 24 is transferred to the thermal heat transfer plate 25 by conduction and heat from the thermal or heat transfer plate 25 is transferred to the heat absorber 26 by conduction.

Upon the thermal imaging apparatus 10, FIG. 5, being used by a fireman in fighting a fire, the thermal imaging apparatus can reside in a burning building where the ambient temperature can be as high as 500° C. Such ambient heat is transferred by convection to the thermal imaging apparatus 10 as indicated by the irregular arrows 34 in FIG. 5. While it is known to the art to provide the shell or casing 12 of the thermal imaging apparatus 10 with thermal insulation, as indicated diagrammatically by the irregular line 35 in FIG. 5, it has been found that the radiant heat 34 from the ambient air of a burning building can be transferred through the shell or case 12 and to the internal components, particularly the focal plane array or infrared detector 20, FIG. 3, with deleterious, if not ruinous, effect. Accordingly, it will be understood that the heat 34 from the ambient air of the burning building can be transferred to the heat absorber 26 by convection and/or conduction depending upon whether or not the heat 34 is transferred directly to the heat absorber 26 or indirectly thereto through, for example, the mounting bracket 24 and thermal or heat transfer plate 25.

The heat absorber 26 of the present invention is illustrated in perspective and diagrammatically in FIG. 6 and shown in diagrammatical transverse cross-section in FIG. 7. As will be understood from FIGS. 6 and 7, the heat absorber 26 may include a generally rectangular and longitudinally extending container 40 which includes side walls 41, 42, 43 and 44 and a pair of ends 46 and 47 shown in FIG. 6. The container 40, FIG. 7, provides an internal cavity 50 for receiving a body of suitable phase change material and which phase change material is indicated in FIG. 7 by the plurality of dots and by general numerical designation 52. In the embodiment of the heat absorber 26 shown in FIG. 7, the wall 41 is made of thermally conductive material which may be, for example, a suitable metal such as aluminum or aluminum alloy, or a suitable thermally conductive plastic material known to the art such as, for example, thermally conductive plastic sold by Chip Coolers, Inc. of Warwick, R.I. and sold under the trademark Cool Poly. The thermally conductive or heat transfer walls 41 is provided with a plurality of evenly spaced apart and inwardly extending members 45 of thermally conductive material which extend into the cavity 50 and into and in thermal engagement with the phase change material 52. The members 45 may be formed integrally with the thermally conductive wall 41 by suitable metal or plastic manufacturing techniques known to the art depending upon the material the heat transfer wall is made. The walls 42, 43 and 44, and the ends 46 and 47, FIG. 6, may be made of a suitable plastic which, if desired, may be of thermally conductive material or which may be of non-thermally conductive material depending on whether or not it is desired that heat be conducted or transferred through the walls 42, 43 and 44 and ends 46 and 47 and thereby to the phase change material 52, or whether or not it is desired that heat transferred by the thermally conductive wall 41 and inwardly extending members 45 to the phase change material 52 not be radiated outwardly through the walls 42, 43 and 44. If it is desired that heat not be radiated outwardly through the walls 42, 43 and 44, they may be made of a suitable insulating material such as for example polycarbonate or modified polyphenylene oxide from G. E. Plastics of Pittsfield, Mass.; or polypropylene from the RTP Company of Winona, Minn. If the wall 41 and members 45 are made of plastic, and the walls 42, 43 and 44 are made of plastic, and injection molded separately, the walls 41 and the walls 42 and 44 may be suitably bonded together by suitable adhesive known to the art for bonding or adhering plastics. In the event the heat transfer wall 41 and inwardly extending members 45 are made of a metal, such as aluminum or an aluminum alloy, and the walls 42, 43 and 44 are made of plastic, the plastic walls 42 and 44 may be bonded to the metal wall 41 by an insulating adhesive, such as silicone rubber adhesive from G. E. Silicones of Waterford, N.Y.

It will be understood that the spacing between and the length of the thermally conductive members 45 will be determined by the thermal conductivity of the material of which the members 45 are made and the sensitivity of the phase change material 50.

Referring further to FIG. 7, the printed circuit boards 23 are indicated diagrammatically in dashed outline and the heat produced by the printed circuit boards and transferred to the thermal or heat transfer plate 25 is indicated diagrammatically in FIG. 7 by the irregular arrows 55. It has been discovered, and in accordance with the teachings of the present invention, that upon such heat being transferred to the thermally conductive wall 41 by conduction, the transfer of such heat to the phase change material 52 is greatly enhanced by the plurality and proximity of spacing of the thermally conductive members 45 extending into and in thermal engagement with the phase change material 52. Upon the heat being transferred to the phase change material 52, the material undergoes a phase change, for example, from a solid to a liquid, and absorbs the heat. It will be further understood in accordance with the teachings of the present invention that the body of phase change material 52 is of sufficient quantity or volume to assure that the heat absorber 26 absorbs sufficient heat, from the above-noted sources, to prevent the temperature of the focal plane array or infrared detector 20, FIG. 3, from varying more than plus or minus 1° C. The heat transfer members 44, in the preferred embodiment, are generally rectangular in shape and extend substantially along the length of the thermally conductive or heat transfer wall 41. Alternatively, the heat transfer and thermally conductive members extending outwardly from the thermally conductive wall 41, and into and in thermal engagement with the phase change material, may be a ii plurality of conical thermally conductive members made of the same material as the thermally conductive wall 41 and formed integrally therewith or mounted suitably thereto.

Figure 8:
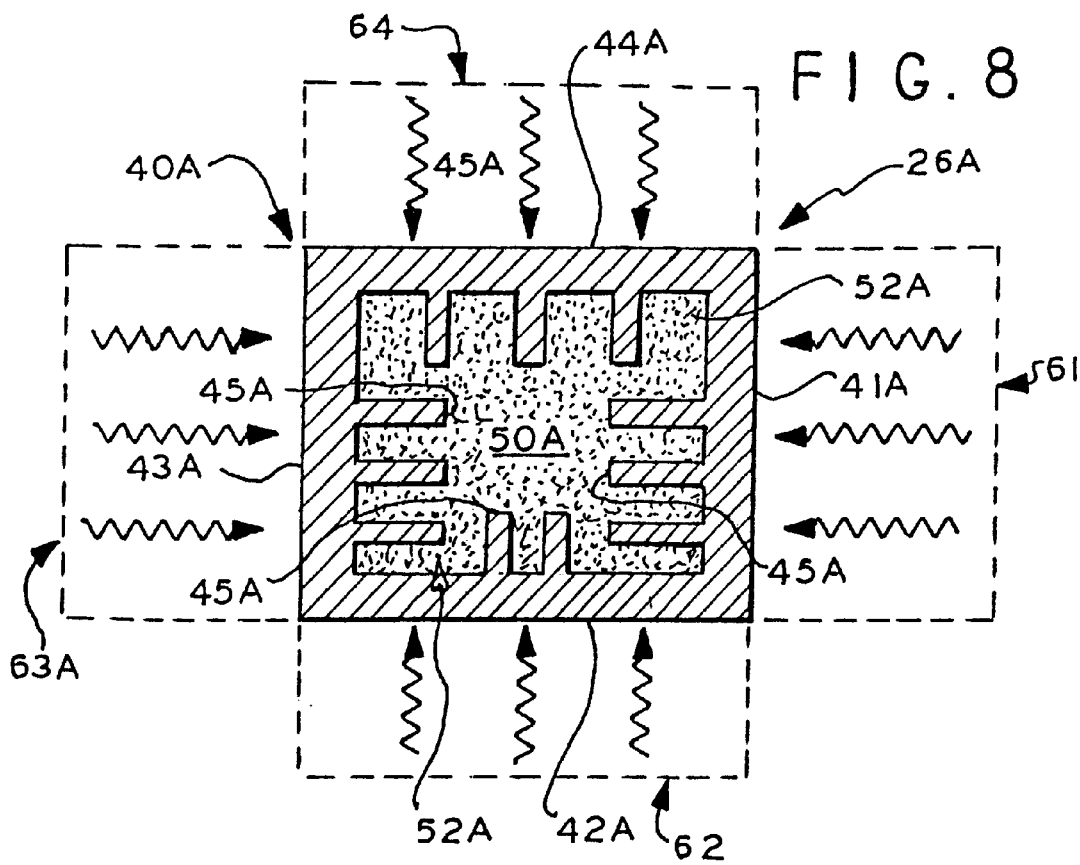
FIG. 8 is a diagrammatical, cross-sectional view of an alternate embodiment of the heat absorber of the present invention.

Referring now to FIG. 8, an alternate embodiment of the heat absorber of the present invention is illustrated in diagrammatical transverse cross-section and indicated by general numerical designation 26A. Heat absorber 26A includes a container 40A providing an internal cavity 50A and a body of suitable phase change material, such as microencapsulated phase change material, resides in the internal cavity 50A and is identified diagrammatically by the plurality of dots which are indicated by general numerical designation 52A. The heat absorber 26A shown in FIG. 8 is particularly useful when it is desired for the heat absorber to absorb heat from, for example, at least four electrical components which produce heat when operated. Such heat producing electrical components are indicated diagrammatically in FIG. 8 by dashed outlines identified by general numerical designations 61, 62, 63 and 64. The container 40A may be made of suitable thermally conductive plastic material, such as the type noted above, and may be made by suitable manufacturing techniques such as injection molding. Alternatively, the container 40 may be made of a suitable thermally conductive metal, such as aluminum or an aluminum alloy, and may be made by casting. It will be understood from FIG. 8 that each of the four walls 41A, 42A, 43A and 44A of the heat absorber 26A are provided with a plurality of inwardly extending members 45A of thermally conductive material extending inwardly into the cavity 50A and into and in thermal engagement with the phase change material 52A. The heat transferred to the heat absorber 26A, by convection and/or conduction, from the plurality of electrical components or apparatus indicated by the dashed outline 61–62, 63 and 64 is indicated by the irregularly shaped arrows residing in the dashed outlines. Upon the heat being transferred to the phase change material 50A, the material undergoes a phase change, for example, a solid to a liquid, and absorbs the heat. The inwardly extending heat transfer members 45A may be substantially rectangular and extend along the length of the respective walls or, alternatively, as noted above with regard to heat absorber 26 illustrated in FIG. 7, the inwardly extending heat transfer members 45A may be a plurality of thermally conductive conical members formed either integrally with the respective walls of the heat absorber 26A or mounted suitably thereto.

Figure 9:
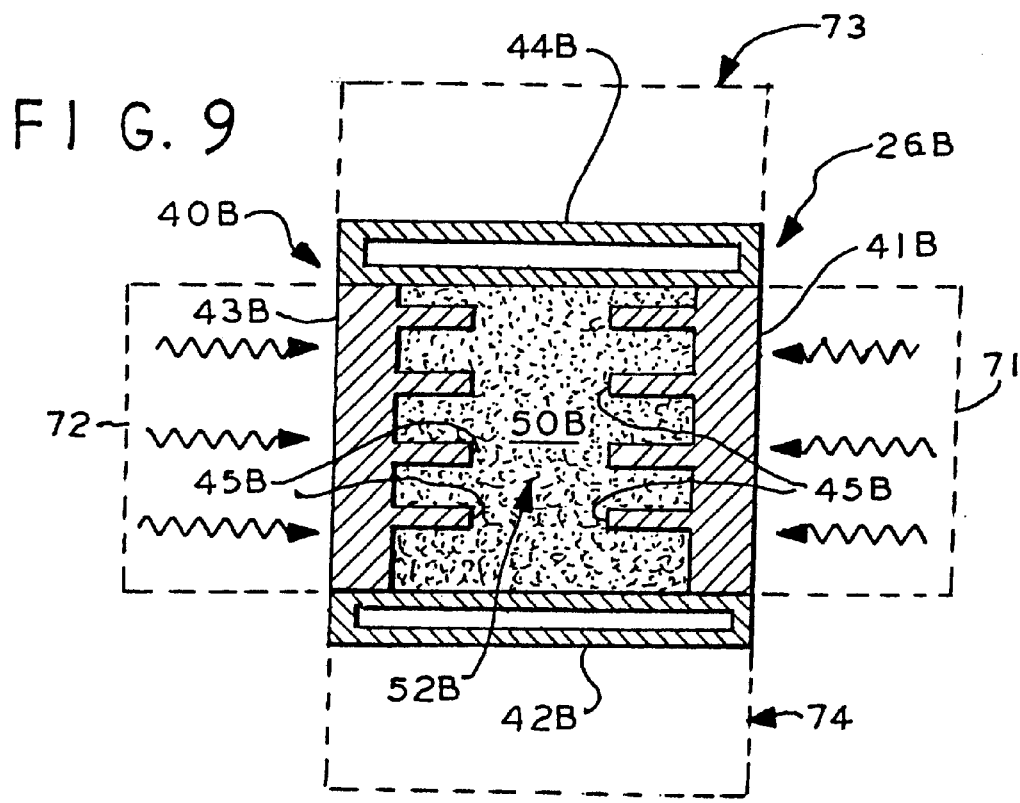
FIG. 9 is a diagrammatical, cross-sectional view illustrating a still further embodiment of the heat absorber of the present invention.

A still further embodiment of the absorber of the present invention is illustrated in diagrammatical, transverse cross-section in FIG. 9 and indicated by general numerical designation 26B. Heat absorber 26B is particularly useful when it is desired to absorb heat from electrical apparatus or components illustrated in FIG. 9 in dashed outline and identified by general numerical designations 71 and 72 and when it is desired not to have the heat absorber 26B transfer heat, by conduction and/or convection, to other heat sensitive electrical apparatus or components illustrated in FIG. 9 in dashed outline and indicated by general numerical designation 73 and 74; such heat sensitive electrical apparatus or components may be proximate, adjacent or in engagement with the heat absorber. In this embodiment, the container walls 41B and 43B may be made of suitable thermally conductive material such as, for example, the above-noted metals or thermally conductive plastic and are provided with a plurality of spaced apart and inwardly extending members 45B of thermally conductive material extending inwardly into the cavity 50B and into and in thermal engagement with the phase change material indicated by general numerical designation 52B. The heat produced by the electrical apparatus and components 71 and 72 is transferred respectively to the container walls 41B and 43B, and the heat transfer members 45B, by convection and/or conduction and such heat is indicated by the irregularly shaped arrows residing in the dashed outlines 71 and 72. Upon heat being transferred to the phase change material 52B, such material undergoes a phase change, such as, for example, from a solid to a liquid, and absorbs the heat. To prevent the absorbed heat from radiating outwardly and being transferred to the heat sensitive electrical components 73 and 74, the container walls 42B and 44B are thermal insulating walls for preventing heat absorbed by the phase change material from being radiated therethrough or transferred to the heat sensitive electrical components 73 and 74. The walls 42B and 44B may be made of suitable thermal insulating plastic material such as polycarbonate or modified polyphenylene oxide from G.E. Plastics of Pittsfield, Mass., or polypropylene from the RTP Company of Winona, Minn., and may be provided with hollow interiors as shown in FIG. 6 causing the thermal insulating walls 42B and 44B to function in the nature of a thermos bottle having a vacuum between concentric walls. Further, the hollow interiors of the thermal insulating walls 42B and 44B may be filled with suitable insulating materials such as, for example, open-cell polyurethane foam, silicone rubber foam, fiberglass batting, or insulating aramid batting, and the like. Alternative to being made of suitable thermally conductive plastic materials, the heat transfer walls 41B and 43B and the inwardly extending heat transfer members 45B may be made of a suitable heat transfer metal such as aluminum or an aluminum alloy, and such elements may be made by casting. Further alternatively, the thermally conductive inwardly extending members 45B may comprise a plurality of inwardly extending and evenly spaced thermally conductive conical members formed either integrally with or suitably mounted to the thermally conductive and heat transfer walls 41D and 43D.

It will be generally understood that the phase change material 52 shown in FIG. 7, the phase change material 52A shown in FIG. 8, and the phase change material 52B shown in FIG. 9, may be suitable phase change material known to the art for changing phase, such as from a solid to a liquid, to absorb heat and which phase change material may be, for example, and not by way of limitation, beeswax, paraffin, hydrated salt, eutectic metals and, in the preferred embodiments of the heat absorbers illustrated in FIGS. 7–9, the phase change material is microencapsulated phase change material in dry or powdered form of the type noted hereinabove in the Background of the Invention.

It will be further understood in accordance with the teachings of the present invention that the heat absorbers of the present invention are replaceable and regenerable heat absorbers. Upon the heat absorbers of the present invention absorbing heat by the phase change material changing phase such as, for example, changing from the solid to the liquid phase, such heat absorbers may be removed from the electrical apparatus, such as the thermal or infrared imaging apparatus 10 of FIGS. 1–4, and such heat absorbers may be regenerated, or have their capacity to absorb heat restored, by being cooled, for example, in ambient air, immersed in cold water, or by having its heat transfer wall, or walls, placed in thermal engagement with a colder surface. Once the heat absorbers of the present invention have been regenerated, they may be replaced in the electrical apparatus, such as the above-noted thermal or infrared imaging apparatus, and used again to absorb heat.

It will be understood that many variations and modifications may be made in the present invention without departing from the spirit and the scope thereof.

What is claimed is:

1. Combination heat absorber and electrical apparatus, comprising:

electrical apparatus which produces heat when operating said electrical apparatus comprising thermal imaging apparatus including an outer shell, a mounting bracket mounted to said outer shell, a focal plane array or microbolometer mounted to said mounting bracket, shutter mechanism mounted to said focal plane array, lens apparatus mounted to said shutter mechanism, at least one printed circuit board mounted to said mounting bracket and producing the heat when operating, and a heat transfer plate mounted to said mounting bracket;

a heat absorber mounted to and in thermal contact with said heat transfer plate and for absorbing the heat;

said heat absorber including a container provided with an internal cavity, a body phase change material residing in said cavity, said container including at least one wall of thermally conductive material in thermal contact with said body of phase change material and said one wall provided with a plurality of spaced apart and inwardly extending members of thermally conductive material extending inwardly into said cavity and into thermal engagement with said body of phase change material.

2. The combination according to claim 1 wherein said one or more printed circuit boards comprise a plurality of printed circuit boards, wherein said combination further includes a plurality of thermally conductive printed circuit board mounting members mounted to and extending outwardly from said mounting bracket, said plurality of printed circuit board mounting members extending through said plurality of printed circuit boards and mounting said plurality of printed circuit boards in a spaced apart vertical relationship and placing said printed circuit boards in thermal engagement with said mounting brackets.

3. The combination according to claim 1 wherein said heat absorber is a replaceable and regenerable heat absorber and wherein said phase change material upon having heat transferred thereto undergoes a phase change to absorb the heat and said phase change material upon being subsequently cooled has its capacity to absorb heat regenerated.

4. The combination according to claim 1 wherein said plurality of spaced apart and inwardly extending members comprise a plurality of generally rectangular members.

5. The combination according to claim 1 wherein said plurality of spaced apart and inwardly extending members comprise a plurality of conical members.

6. The combination according to claim 1 wherein said container is generally rectangular and includes three additional walls and two ends of thermally conductive material in thermal contact with said body of phase change material.

7. The combination according to claim 6 wherein at least one of said additional walls is provided with a plurality of spaced apart and inwardly extending members of thermally conductive material extending inwardly into said cavity and into and in thermal engagement with said phase change material.

8. The combination according to claim 6 wherein each of said three additional walls is provided with a plurality of inwardly extending members of thermally conductive material extending inwardly into said cavity and into and in thermal engagement with said phase change material.

9. The combination according to claim 7 wherein said plurality of spaced apart and inwardly extending members of thermally conductive material provided on said at least one additional wall are generally rectangular in shape.

10. The combination according to claim 1 wherein said plurality of spaced apart and inwardly extending members of thermally conductive material provided on said at least one additional wall are conical.

11. The combination according to claim 1 wherein said thermally conductive material is a thermally conductive plastic.

12. The combination according to claim 1 wherein said thermally conductive material is metal.

13. The combination according to claim 1 wherein said metal is aluminum or aluminum alloy.

14. The combination according to claim 1 wherein said container is substantially rectangular and includes three additional walls in addition to said one wall and two ends and wherein one of said additional walls is opposite said one wall and is made of thermally conductive material and is provided with a plurality of spaced apart and inwardly extending members of thermally conductive material extending inwardly into said cavity and into and in thermal engagement with said phase change material.

15. The combination according to claim 1 wherein said phase change material upon having heat transferred thereto undergoes a phase change to absorb the heat and wherein said other two additional walls are opposed and made of insulating material for preventing the heat absorbed by said phase change material from being transferred outwardly of said container through said two additional walls.

16. The combination according to claim 1 wherein said container is substantially rectangular and includes three additional walls and two ends and wherein each of said three additional walls is made of thermally conductive material and are each provided with a plurality of inwardly extending members extending inwardly into said cavity and into and in thermal engagement with said phase change material.

17. The combination according to claim 1 wherein said phase change material is microencapsulated phase change material.

* * * * *